US010001952B2

(12) United States Patent
Jeon (10) Patent No.: US 10,001,952 B2
(45) Date of Patent: Jun. 19, 2018

(54) DATA STORAGE DEVICE AND OPERATING METHOD THEREOF INCLUDING READ ERROR CORRECTION (71) Applicant: SK hynix Inc., Gyeonggi-do (KR)

(72) Inventor: Myeong Woon Jeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/246,152

(22) Filed: Aug. 24, 2016

(65) Prior Publication Data
US 2017/0293524 A1 Oct. 12, 2017

(30) Foreign Application Priority Data

Apr. 11, 2016 (KR) .......................... 10-2016-0044045

(51) Int. Cl.
G11C 16/26 (2006.01)
G11C 29/52 (2006.01)
G06F 3/06 (2006.01)
G06F 11/10 (2006.01)

(52) U.S. Cl.
CPC ............ G06F 3/0679 (2013.01); G06F 3/064 (2013.01); G06F 3/0619 (2013.01); G06F 11/1012 (2013.01); G11C 16/26 (2013.01); G11C 29/52 (2013.01)

(58) Field of Classification Search
None
See application file for complete search history.

(56) References Cited

U.S. PATENT DOCUMENTS

2013/0073924 A1* 3/2013 D'Abreu ............. G06F 11/1048
714/763
2014/0143637 A1* 5/2014 Cohen ................ H03M 13/1108
714/773

FOREIGN PATENT DOCUMENTS

KR 1020140098702 8/2014
KR 1020150099795 9/2015

* cited by examiner

Primary Examiner — J. H. Hur
(74) Attorney, Agent, or Firm — IP & T Group LLP (57) ABSTRACT A data storage device includes a nonvolatile memory device including a plurality of memory cells; and a controller suitable for reading target data from a target page corresponding to the plurality of memory cells, estimating error bits of the target data based on reference data read from at least one reference page corresponding to the plurality of memory cells of the target data, and performing an error correction operation to the target data based on a result of the estimation.

19 Claims, 11 Drawing Sheets

Unreliable memory cells

| Memory cells | C11 | C12 | C13 | C14 | C15 | C16 | C17 | ... |
|---|---|---|---|---|---|---|---|---|
| REFDT(LSB) | [0] | 1 | [1] | [0] | 0 | 1 | 0 | ... |
| REFDT(CSB1) | [1] | 1 | [0] | [1] | 0 | 1 | 0 | ... |
| TGDT(CSB2) | 0 | 1 | 1 | 1 | 0 | 0 | 1 | ... |

Error bits

DATA STORAGE DEVICE AND OPERATING METHOD THEREOF INCLUDING READ ERROR CORRECTION

CROSS-REFERENCES TO RELATED APPLICATION

The present application claims priority under 35 U.S.C. § 119(a) to Korean application number 10-2016-0044045, filed on Apr. 11, 2016, in the Korean Intellectual Property Office, which is incorporated herein by reference in its entirety.

BACKGROUND

1. Technical Field

Various embodiments of the present invention relate generally to a data storage device and, more particularly, to a data storage device including a nonvolatile memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices can be embedded in external devices or fabricated separately and then connected afterwards.

SUMMARY

In an embodiment, a data storage device may include: a nonvolatile memory device including a plurality of memory cells; and a controller suitable for reading target data from a target page corresponding to the plurality of memory cells, estimating error bits of the target data based on reference data read from at least one reference page corresponding to the plurality of memory cells of the target data, and performing an error correction operation to the target data based on a result of the estimation.

In an embodiment, a method for operating a data storage device may include: reading target data from a target page corresponding to a plurality of memory cells; estimating error bits of the target data based on reference data read from at least one reference page corresponding to the plurality of memory cells of the target data; and performing an error correction operation to the target data based on a result of the estimation.

In an embodiment, a data storage device may include: a nonvolatile memory device including a plurality of memory cells; and a controller suitable for estimating, based on at least one reference bit read from a target memory cell, whether a target bit read from the target memory cell is an error bit.

BRIEF DESCRIPTION OF THE DRAWINGS

Embodiments of the present invention will now be described in reference to the following drawings, in which.

DETAILED DESCRIPTION

Hereinafter, a data storage device and an operating method thereof according to the present invention will be described with reference to the accompanying drawings. The present invention may, however, be embodied in different forms and should not be construed as being limited to the embodiments set forth herein. Rather, these embodiments are provided for describing the present invention in sufficient detail so that a person skilled in the art to which the invention pertains can make and use the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 1:
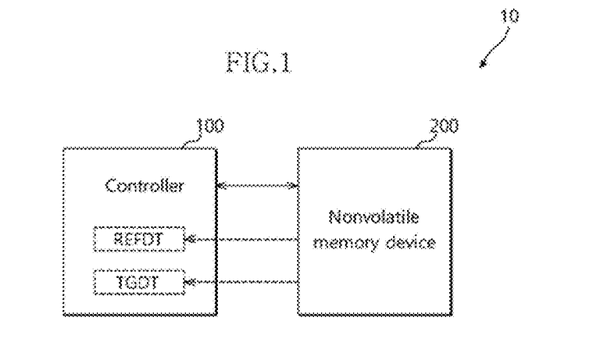
FIG. 1 is a simplified block diagram illustrating a data storage device including a controller and a nonvolatile memory device, according to an embodiment of the present invention.

Referring now to FIG. 1 a data storage device 10 is provided, according to an embodiment of the present invention.

The data storage device 10 may be configured to store data provided from an external device (not shown), in response to a write request from the external device. Also, the data storage device 10 may be configured to provide stored data to the external device, in response to a read request from the external device.

The data storage device 10 may be configured as a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

As illustrated in the embodiment of FIG. 1, the data storage device 10 includes controller 100 and nonvolatile memory device 200 operatively coupled to one another.

The controller 100 may control the operations of the data storage device 10. The controller 100 may, for example, store data in the nonvolatile memory device 200 in response to a write request transmitted from the external device. The controller 100 may also, for example, read data stored in the nonvolatile memory device 200 and output read data to the external device in response to a read request received from the external device.

More specifically, according to the embodiment of FIG. 1, the controller 100 may read target data TGDT from a target page corresponding to a plurality of memory cells of the nonvolatile memory device 200. The controller 100 may estimate error bits of the target data TGDT based on reference data REFDT read from at least one reference page corresponding to the same memory cells as the target data TGDT, and perform an error correction operation to the target data TGDT based on the estimation result.

In more detail, the controller 100 may identify unreliable memory cells among the plurality of memory cells based on the reference data REFDT, and estimate a part of the target data TGDT read from the unreliable memory cells as error bits. For example, the controller 100 may identify memory cells as unreliable memory cells, when the reference data REFDT read from the memory cells have one or more bits of a predetermined value. Among the threshold voltage distributions of the memory cells of the nonvolatile memory device 200, the unreliable memory cells may be positioned in unreliable threshold voltage distributions of the target data TGDT. As will be described later, the unreliable threshold voltage distributions of the target data TGDT may include threshold voltage distributions adjacent to respective target read voltages used to read the target data TGDT.

In the present embodiment, a reference page, from which the reference data REFDT is read, may depend upon the target page, from which the target data TGDT is read. As will be described later, a read operation may be performed to the reference page with read voltages positioned at the boundaries between the unreliable threshold voltage distributions of the target data TGDT and the remaining threshold voltage distributions.

According to an embodiment, the controller 100 may perform a pre-error correction operation to the target data TGDT. Various error correction techniques known in the art may be employed for the pre-error correction operation. When a pre-error correction operation to target data TGDT fails, the controller 100 may perform the above-described error bit estimation operation and error correction operation to the target data TGDT.

According to an embodiment, the controller 100 may perform the error bit estimation operation and error correction operation only when the reference data REFDT has been read in advance. The controller 100 may not perform the error bit estimation operation and error correction operation to the target data TGDT when the reference data REFDT has not been read in advance. The reference data REFDT may be read in advance when the reference data REFDT is read earlier than the target data TGDT according to a request from the external device and remains in the controller 100 until the target data TGDT is read. Such a policy may be adopted to prevent a delay in operation.

The controller 100 may perform the error correction operation based on the error bit estimation result in a variety of ways.

For example, the controller 100 may adjust a log likelihood ratio (LLR) value by decreasing the magnitude of an LLR value corresponding to estimated error bits, and perform the error correction operation based on the adjusted LLR value. For example, the controller 100 may set the magnitude of an LLR value corresponding to estimated error bits as smaller than LLR values corresponding to the other bits.

For another example, the controller 100 may generate a set of candidate data by performing a bit flip operation to the estimated error bits of the target data TGDT, and perform the error correction operation to the set of candidate data. Since various error correction techniques known in the art may be applied to the error correction operation, detailed description will be omitted herein.

According to control of the controller 100, the nonvolatile memory device 200 may store data transmitted from the controller 100, may read stored data and transmit read data to the controller 100. According to control of the controller 100, the nonvolatile memory device 200 may read the target data TGDT and the reference data REFDT and transmit the read target data TGDT and reference data REFDT to the controller 100.

The nonvolatile memory device 200 may be or include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

While it is illustrated that the data storage device 10 of FIG. 1 includes one nonvolatile memory device 200, it is to be noted that the number of nonvolatile memory devices included in the data storage device 10 may vary.

Figure 2:
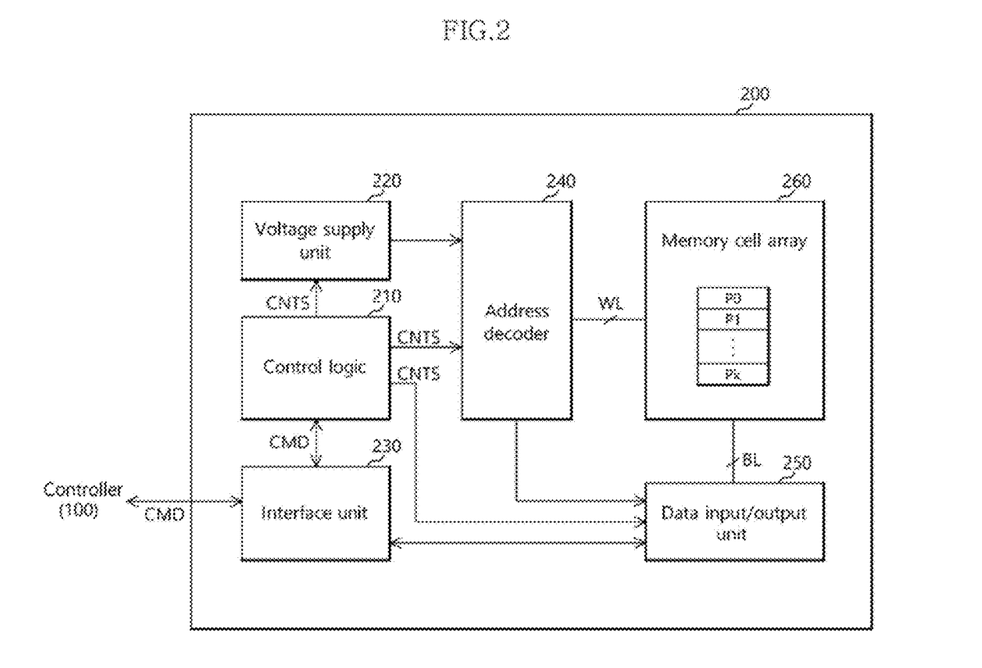
FIG. 2 is a more detailed block diagram illustrating an example of a configuration of the nonvolatile memory device of FIG. 1.

Referring now to FIG. 2, the nonvolatile memory device 200 of FIG. 1, according to an embodiment, may include a control logic 210, a voltage supply unit 220, an interface unit 230, an address decoder 240, a data input/output unit 250, and a memory region 260.

The control logic 210 may control the operations of the nonvolatile memory device 200 according to control of the controller 100. The control logic 210 may receive a command CMD transmitted from the controller 100, from the interface unit 230, and may transmit control signals CNTS to internal units of the nonvolatile memory device 200 in response to the command.

The voltage supply unit 220 may generate various operation voltages necessary for general operations of the nonvolatile memory device 200, according to control of the control logic 210. For example, the voltage supply unit 220 may supply various voltages to be used in write and read operations, to the address decoder 240.

The interface unit 230 may exchange various control signals including commands and addresses and data with the controller 100. The interface unit 230 may transmit various control signals and data inputted thereto, to the internal units of the nonvolatile memory device 200.

The address decoder 240 may decode addresses to select portions to be accessed in the memory region 260. The address decoder 240 may selectively drive word lines WL and control the data input/output unit 250 to selectively drive bit lines BL, according to decoding results.

The data input/output unit 250 may transmit data transmitted from the interface unit 230, to the memory region 260 through the bit lines BL. The data input/output unit 250 may transmit data read from the memory region 260 through the bit lines BL, to the interface unit 230. The data input/output unit 250 may sense current formed as memory cells included in the memory region 260 are turned on and off in response to a read voltage, and may obtain data read from the memory cells, according to sensing results.

The memory region 260 may be coupled with the address decoder 240 through the word lines WL, and may be coupled with the data input/output unit 250 through the bit lines BL. The memory region 260 may include a plurality of memory cells which are respectively disposed at areas where the word lines WL and the bit lines BL intersect with each other and in which data are stored. The memory region 260 may include a memory cell array of a two-dimensional or three-dimensional structure.

The memory region 260 may include a plurality of pages P0 to Pk. Each of the pages P0 to Pk may be accessed as a corresponding word line is driven.

Figure 3:
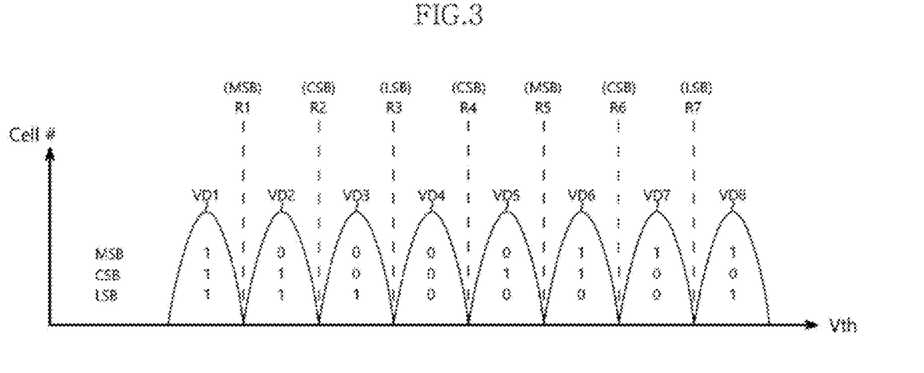
FIG. 3 is a diagram illustrating examples of threshold voltage distributions of memory cells of the nonvolatile memory device.

FIG. 3 is a diagram illustrating an example of threshold voltage distributions VD1 to VD8 of memory cells of the nonvolatile memory device of FIG. 2. The horizontal axis Vth represents a threshold voltage of a memory cell, and the vertical axis Cell #represents the number of memory cells corresponding to a threshold voltage.

In FIG. 3, each of the memory cells may store 3 bits including a least significant bit (LSB), a central significant bit (CSB) and a most significant bit (MSB). Nevertheless, the number of bits to be stored in each memory cell according to the present embodiment is not limited to such. The LSB, CSB and MSB may be stored in LSB, CSB and MSB pages, respectively. The memory cells of the threshold voltage distributions VD1 to VD8 may correspond to LSB, CSB and MSB pages.

For example, memory cells may have the threshold voltage distributions VD1 to VD8 according to data stored therein. A memory cell may be controlled to have a threshold voltage corresponding to any one among the 8 threshold voltage distributions VD1 to VD8 according to 3-bit data to be stored therein. For example, as illustrated in FIG. 3, a memory cell storing data of binary value "111" may have a threshold voltage corresponding to the threshold voltage distribution VD1, a memory cell storing data of binary value "011" may have a threshold voltage corresponding to the threshold voltage distribution VD2, a memory cell storing data of binary value "001" may have a threshold voltage corresponding to the threshold voltage distribution VD3, a memory cell storing data of binary value "000" may have a threshold voltage corresponding to the threshold voltage distribution VD4, a memory cell storing data of binary value "010" may have a threshold voltage corresponding to the threshold voltage distribution VD5, a memory cell storing data of binary value "110" may have a threshold voltage corresponding to the threshold voltage distribution VD6, a memory cell storing data of binary value "100" may have a threshold voltage corresponding to the threshold voltage distribution VD7, and a memory cell storing data of binary value "101" may have a threshold voltage corresponding to the threshold voltage distribution VD8.

A memory cell may be turned on or off according to a threshold voltage, when a predetermined read voltage is applied through a corresponding word line. For example, a memory cell may be turned on when a read voltage higher than its threshold voltage is applied, and may be turned off when a read voltage lower than its threshold voltage is applied. By sensing current formed when a memory cell is turned on/off, it is possible to determine whether the threshold voltage of the memory cell is higher or lower than a read voltage. The bit value of a memory cell represented by a threshold voltage of the memory cell may be determined according to read voltages R1 to R7 positioned between the threshold voltage distributions VD1 to VD8, and as a result, data of the memory cell may be read according to the threshold voltage of the memory cell and the read voltages R1 to R7 based on the threshold voltage distribution of the memory cells.

Referring to FIG. 3, the respective read voltages R1 to R7 discriminate bit values of different pages among the LSB, CSB and MSB pages. That is, the respective LSB, CSB and MSB pages are related with different target read voltages among the read voltages R1 to R7. For example, MSB read voltages R1 and R5 discriminate bit values of the MSB pages; CSB read voltages R2, R4 and R6 discriminates bit values of the CSB pages; and LSB read voltages R3 and R7 discriminates bit values of the LSB pages. A target page may be any one of the LSB, CSB and MSB pages, and thus the target read voltage may be determined according to which one of the LSB, CSB and MSB pages is the target page. Unreliable memory cells have threshold voltages which are positioned in unreliable threshold voltage distributions of the target data TGDT which are adjacent to the respective target read voltages used to read the target data TGDT. A read operation may be performed for a reference page with a read voltage positioned at the boundaries between the unreliable threshold voltage distributions of the target data TGDT and the remaining threshold voltage distributions, and thus the reference page may also depend upon the LSB, CSB and MSB pages as the target page.

The threshold voltage of a memory cell may erroneously change for various reasons, such as, interference between adjacent memory cells and discharge due to lapse of time. For example, when the threshold voltage of a memory cell originally positioned in the threshold voltage distribution VD4 changes to be positioned in another threshold voltage distribution VD3, the bit value of the memory cell is erroneously read as another value other than the original value. For example, even though data "000" (corresponding to the threshold voltage distribution VD4) is originally written in the corresponding memory cell, data "001" (corresponding to the threshold voltage distribution VD3) may be erroneously read from the corresponding memory cell due to the shift of the threshold voltage of the memory cell. An erroneous shift (a substantial shift causing an erroneous data reading) of the threshold voltage may generally occur when the original threshold voltage of a memory cell is positioned near the read voltage (e.g., the LSB read voltage R3 between the threshold voltage distributions VD3 and VD4).

However, when the threshold of a memory cell which is initially positioned in a first threshold voltage distribution, for example in the VD4 threshold voltage distribution, is erroneously shifted in a second threshold voltage distribution, for example the VD3 threshold voltage distribution, thus erroneously changing the LSB value of the memory cell, the CSB and MSB values of the same memory cell do not change and thus an error may not occur in the CSB and MSB value of the memory cell despite the change of the threshold voltage. Hence, as will be described later herein, unreliable threshold voltage distributions corresponding to the LSB, CSB and MSB pages may be defined.

Figure 4A:
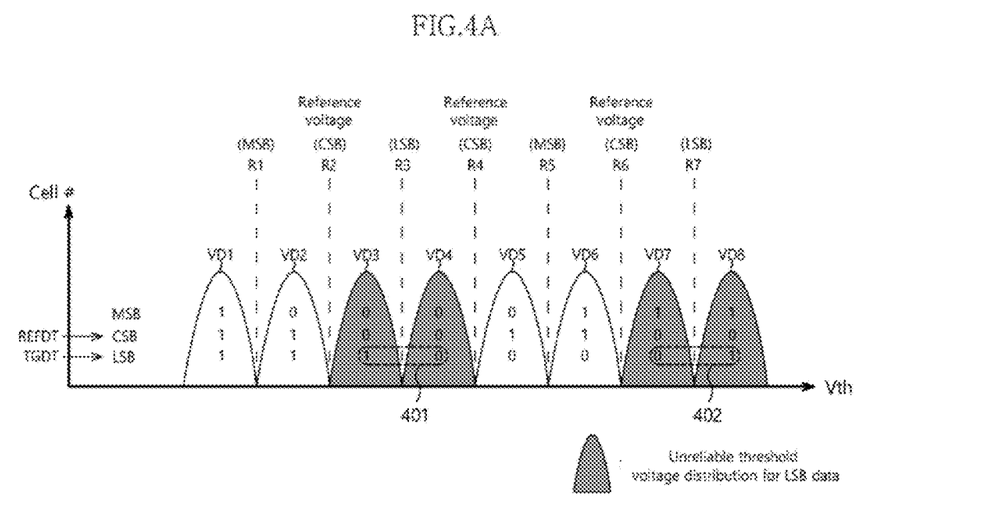
FIG. 4A is an example of threshold voltage distributions of memory cells illustrating a method for determining unreliable memory cells, according to an embodiment of the present invention.
Figure 4B:
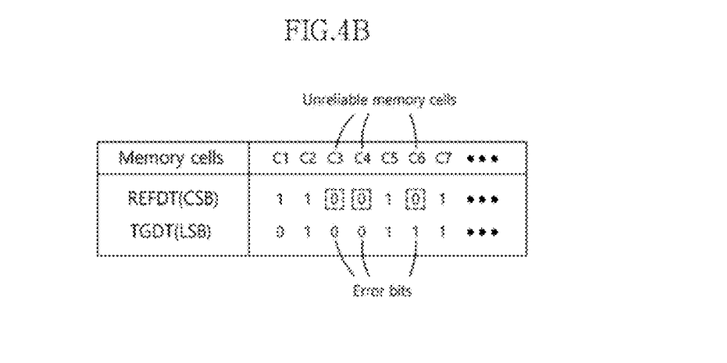
FIG. 4B is an example of reference data and target data of memory cells illustrating a method for estimating error bits of the target data, according to an embodiment of the present invention.

FIG. 4A is an example of threshold voltage distributions of memory cells illustrating a method for determining unreliable memory cells for the LSB data as the target data TGDT. FIG. 4B is an example of reference data and target data TGDT of memory cells illustrating a method for estimating error bits of the LSB data as the target data TGDT.

Referring to FIG. 4A, memory cells with threshold voltages positioned in the threshold voltage distributions VD3 and VD4 output different LSB data value 401 with reference to the LSB read voltage R3. Also, memory cells positioned in the threshold voltage distributions VD7 and VD8 output different LSBs 402 with reference to the LSB read voltage R7. Accordingly, LSBs read from the memory cells positioned in the threshold voltage distributions VD3, VD4, VD7 and VD8, which are adjacent to the LSB read voltages R3 and R7, may have high unreliability. This is because memory cells near the LSB read voltages R3 and R7 in the threshold voltage distributions VD3, VD4, VD7 and VD8 are vulnerable to an erroneous shift of their threshold voltage and thus the LSB value of the memory cells near the LSB read voltages R3 and R7 may be susceptible to the error.

From this viewpoint, unreliable threshold voltage distributions for the LSB data may be defined to include the threshold voltage distributions VD3, VD4, VD7 and VD8 adjacent to the LSB read voltages R3 and R7. A memory cell having a threshold voltage determined as being positioned in the unreliable threshold voltage distributions VD3, VD4, VD7 and VD8 for the LSB data has a great possibility of outputting erroneous LSB values 401 and 402, i.e., LSB values which are different from their original LSB values, with reference to the LSB read voltages R3 and R7. The memory cells determined as being positioned in the unreliable threshold voltage distributions VD3, VD4, VD7 and VD8 for the LSB data may be estimated as outputting the LSBs as error bits. Hereinbelow, memory cells determined as being positioned in unreliable threshold voltage distributions e.g., in the threshold voltage distributions VD3, VD4, VD7 and VD8 adjacent to the LSB read voltages R3 and R7 for the LSB data are defined as the unreliable memory cells for the LSB data.

In the illustrated embodiment of FIG. 4A, in order to determine the unreliable memory cells for the LSB data, the reference data REFDT read according to the CSB read voltages R2, R4 and R6 may be used as the reference voltages for the LSB data. As described above, even when the threshold voltage of a memory cell is initially positioned in the threshold voltage distribution VD4 and then erroneously changes to be positioned in the threshold voltage distribution VD3 and thus the LSB value of the memory cell erroneously changes, the CSB and MSB values of the memory cell do not change and thus an error does not occur in the CSB and MSB values of the memory cell despite the change of the threshold voltage. The reason why the CSB read voltages R2, R4 and R6 are used as the reference voltages for the LSB data is because the CSB read voltages R2, R4 and R6 may distinguish the unreliable threshold voltage distributions VD3, VD4, VD7 and VD8 for the LSB data from the remaining threshold voltage distributions VD1, VD2, VD5 and VD6. In other words, the CSB read voltages R2, R4 and R6 are positioned at the boundaries between the unreliable threshold voltage distributions (VD3, VD4, VD7 and VD8) for the LSB data and the remaining threshold voltage distributions (VD1, VD2, VD5 and VD6). Hence, as illustrated in FIG. 4A, the CSB read voltage R2 is positioned at the boundary between the unreliable threshold distributions VD3 for the LSB data and the threshold voltage distribution VD2. Also, as illustrated in FIG. 4A, the CSB read voltage R4 is positioned at the boundary between the unreliable threshold distribution VD4 for the LSB data and the threshold voltage distribution VD5, and the CSB read voltage R6 is positioned at the boundary between the unreliable threshold distribution VD7 for the LSB data and the threshold voltage distribution VD6.

Because the reference voltages R2, R4 and R6 are CSB read voltages, the CSB page may be defined as the reference page, and CSB data may be used as the reference data REFDT. Because the reference data REFDT (i.e., the CSB data) is outputted as a first value of "0," from the unreliable memory cells and is outputted as a second value of "1" from the remaining memory cells, the unreliable memory cells and the remaining memory cells may be clearly distinguished from each other by the reference voltages R2, R4 and R6. As a result, memory cells which output the CSBs of the first value "0" according to the CSB read voltages R2, R4 and R6 may be determined as the unreliable memory cells for the LSB data.

FIG. 4B exemplarily shows the CBS data as the reference data REFDT, and the LSB data as the target data TGDT, which are read from memory cells C1 to C7. In FIG. 4B, the memory cells C3, C4 and C6 which output "0" as CSBs may be determined as the unreliable memory cells, and LSBs read from the unreliable memory cells C3, C4 and C6 may be estimated as error bits.

Figure 5A:
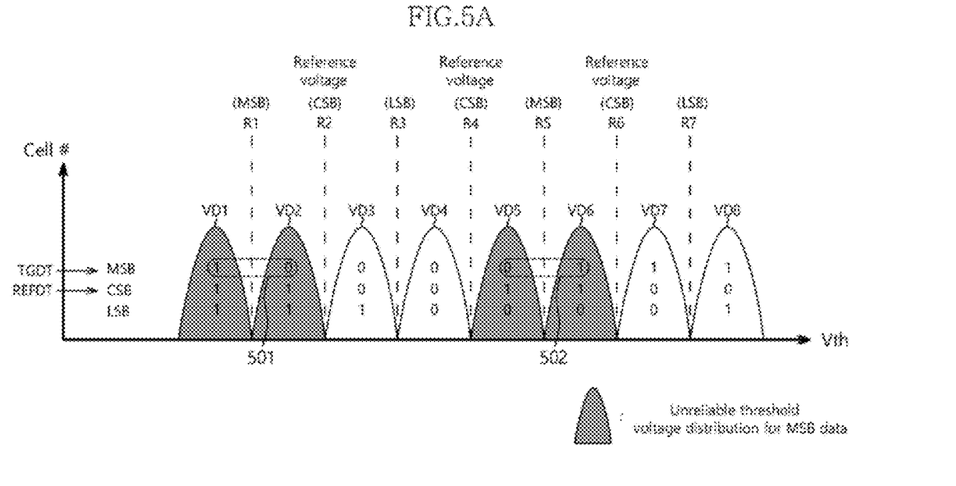
FIG. 5A is another example of threshold voltage distributions of memory cells illustrating a method for determining unreliable memory cells.
Figure 5B:
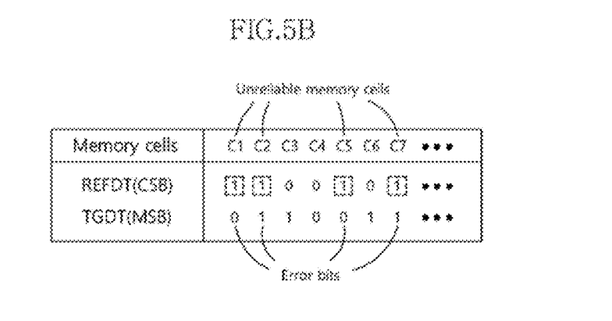
FIG. 5B is another example of reference data and target data of memory cells illustrating a method for estimating error bits of the target data.

FIG. 5A is another example of threshold voltage distributions of memory cells illustrating a method for determining unreliable memory cells for MSB data as the target data TGDT. FIG. 5B is another example of reference data and target data TGDT of memory cells illustrating a method for estimating error bits of the MSB data as the target data TGDT.

Referring to FIG. 5A, similarly as described above for LSB data with reference to FIG. 4A, the unreliable threshold voltage distributions for the MSB data as the target data TGDT may be defined. The unreliable threshold voltage distributions for the MSB data may include the threshold voltage distributions VD1, VD2, VD5 and VD6 adjacent to the MSB read voltages R1 and R5. This is because memory cells near the MSB read voltages R1 and R5 in the threshold voltage distributions VD1 to VD8 are vulnerable to an erroneous change of the threshold voltage and thus the MSB value of the memory cells near the MSB read voltages R1 and R5 may be susceptible to the error. Memory cells determined as being positioned in the unreliable threshold voltage distributions VD1, VD2, VD5 and VD6 for the MSB data, that is, the unreliable memory cells for the MSB data, may have a great possibility of outputting the MSB values 501 and 502, which are different from their original MSB values or have errors, with reference to the MSB read voltages R1 and R5.

In order to determine the unreliable memory cells for the MSB data, the reference data REFDT read according to the CSB read voltages R2, R4 and R6 may be used as the reference voltages for the MSB data. For example, even when the threshold of the memory cell is initially positioned in the threshold voltage distribution VD2 and erroneously change to be positioned in the threshold voltage distribution VD1 and thus the MSB value of the memory cell may erroneously change, the CSB and LSB value of the memory cell do not change and thus an error may not occur in the CSB and LSB value of the memory cell despite the change of the threshold voltage. The reason why the CSB read voltages R2, R4 and R6 are used as the reference voltages for the MSB data is because the CSB read voltages R2, R4 and R6 may distinguish the unreliable threshold voltage distributions VD1, VD2, VD5 and VD6 for the MSB data from the remaining threshold voltage distributions VD3, VD4, VD7 and VD8. In other words, the CSB read voltages R2, R4 and R6 may be read voltages which are positioned at the boundaries between the unreliable threshold voltage distributions VD1, VD2, VD5 and VD6 for the MSB data and the remaining threshold voltage distributions VD3, VD4, VD7 and VD8.

In the meantime, because the reference voltages R2, R4 and R6 are CSB read voltages, the CSB page may be defined as the reference page, and CSB data may be used as the reference data REFDT. Because the reference data REFDT (I.e., the CSB data) is outputted as a first value of "1," from the unreliable memory cells and is outputted as a second value of "0" from the remaining memory cells, the unreliable memory cells and the remaining memory cells may be clearly distinguished from each other by the reference voltages R2, R4 and R6. As a result, memory cells which output the CSBs of the first value "1" according to the CSB read voltages R2, R4 and R6 may be determined as the unreliable memory cells for the MSB data.

FIG. 5B exemplarily shows the CSB data as the reference data REFDT, and the MSB data as the target data TGDT, which are read from memory cells C1 to C7. In FIG. 5B, the memory cells C1, C2, C5 and C7 which output "1" as CSBs may be determined as the unreliable memory cells, and MSBs read from the unreliable memory cells C1, C2, C5 and C7 may be estimated as error bits.

Figure 6A:
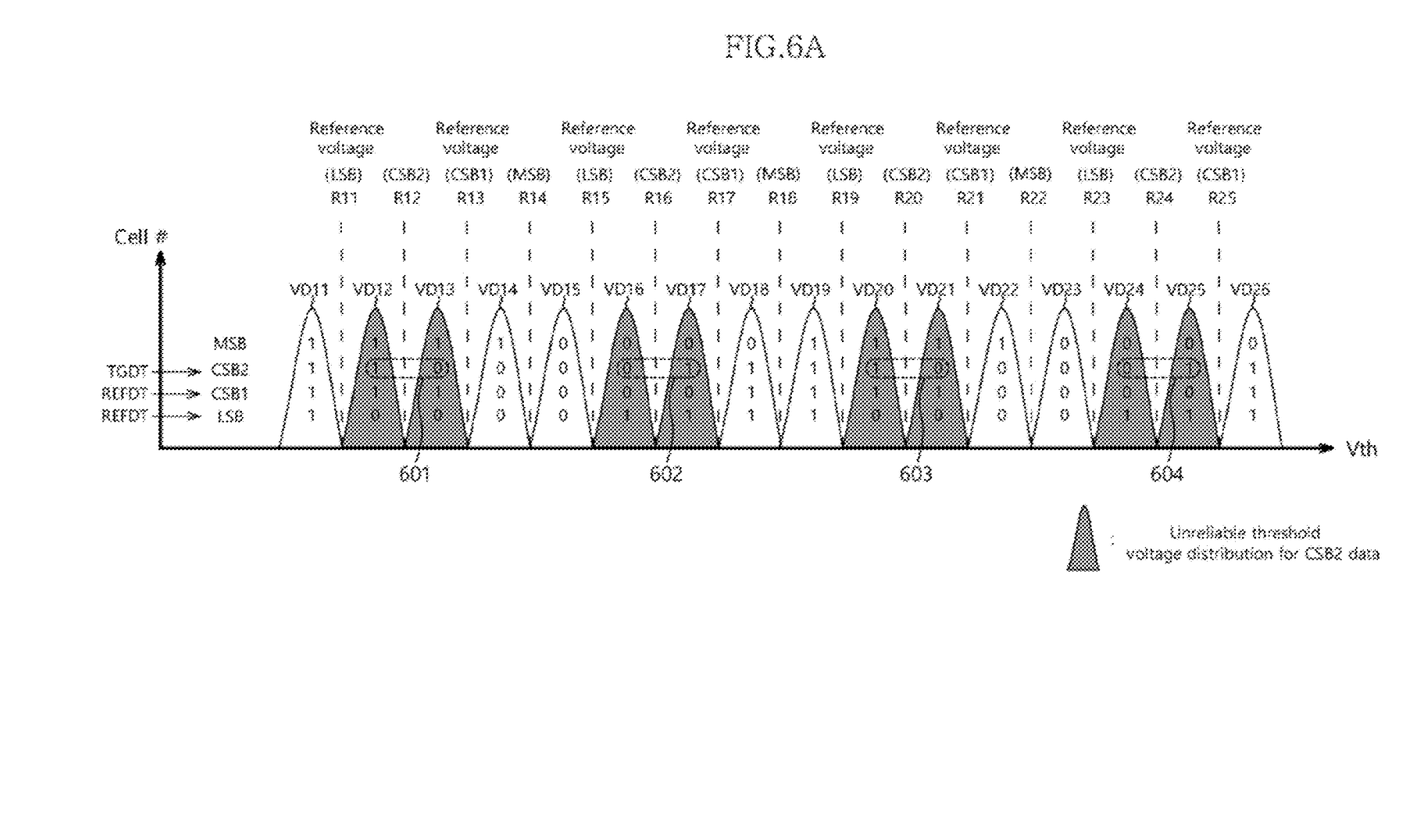
FIG. 6A is another example of threshold voltage distributions of memory cells illustrating a method for determining unreliable memory cells.
Figure 6B:
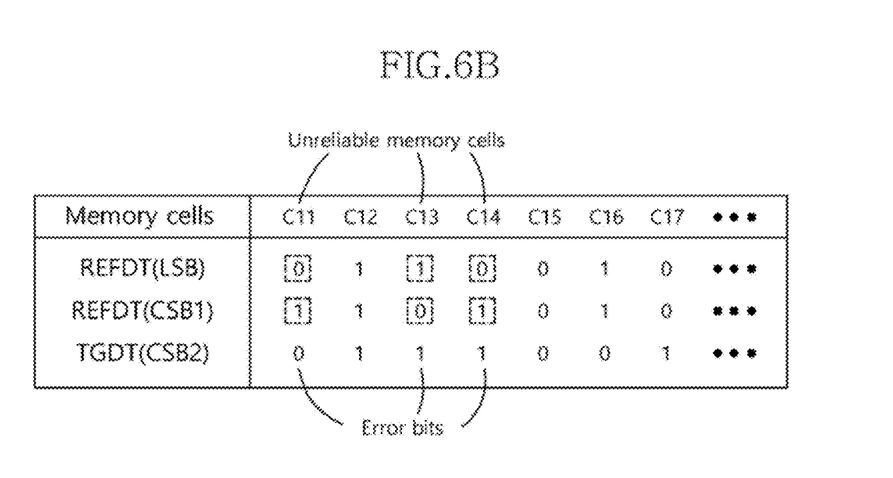
FIG. 6B is another example of reference data and target data of memory cells illustrating a method for estimating error bits of the target data.

FIG. 6A is another example of threshold voltage distributions of memory cells illustrating the method for determining unreliable memory cells for CSB2 data of quad level cells (QLC) as the target data TGDT. FIG. 6B is another example of reference data and target data TGDT of memory cells illustrating the method for estimating error bits of the CSB2 data of QLC as the target data TGDT.

Referring to FIG. 6A, there are shown threshold voltage distributions VD11 to VD26 of QLCs each storing 4-bit data and read voltages R11 to R25 for the QLCs. Even in the case of QLC, unreliable memory cells may be determined and error bits may be estimated for the respective LSB, CSB1, CSB2 and MSB data according to a method which is substantially identical to the above-described method for 3-bit data memory cells. However, as the number of the reference voltages is increased, the reference data REFDT should be read from at least two reference pages in order to determine the unreliable memory cells for the respective LSB, CSB1, CSB2 and MSB data.

As an example, the unreliable threshold voltage distributions for the CSB2 data may be defined as follows. Referring to FIG. 6A, the unreliable threshold voltage distributions for the CSB2 data may include threshold voltage distributions VD12, VD13, VD16, VD17, VD20, VD21, VD24 and VD25 adjacent to CSB2 read voltages R12, R16, R20 and R24. Memory cells determined as being positioned in the unreliable threshold voltage distributions VD12, VD13, VD16, VD17, VD20, VD21, VD24 and VD25 for the CSB2 data (i.e., the unreliable memory cells for CSB2 data) may output different CSB2 data values 601 to 604 with reference to the CSB2 read voltages R12, R16, R20 and R24, respectively. Accordingly, CSB2 data values 601 to 604 read from the memory cells positioned in the threshold voltage distributions VD12, VD13, VD16, VD17, VD20, VD21, VD24 and VD25 for the CSB2 data, which are adjacent to the CSB2 read voltages R12, R16, R20 and R24, have high unreliability. This is because memory cells near the CSB2 read voltages R12, R16, R20 and R24 in the threshold voltage distributions VD11 to VD26 are vulnerable to an erroneous change of their threshold voltage and thus the CSB2 value of the memory cells near the CSB2 read voltages R12, R16, R20 and R24 is susceptible to an error. The unreliable memory cells for the CSB2 data may be estimated as outputting CSB2s as error bits.

For determining the unreliable memory cells for the CSB2 data, the reference data REFDT read according to the LSB and CSB1 read voltages R11, R13, R15, R17, R19, R21, R23 and R25 may be used as the reference voltages for the CSB2 data. For example, when the threshold of the memory cell is initially positioned in the threshold voltage distribution VD13 and then erroneously changes to be positioned in the threshold voltage distribution VD12 and thus the CSB2 value of the memory cell erroneously changes. However, the other MSB, CSB1 and LSB values of the memory cell do not change and thus an error may not occur in the MSB, CSB1 and LSB values of the memory cell despite the change of its threshold voltage. The LSB and CSB1 read voltages R11, R13, R15, R17, R19, R21, R23 and R25 are used as the reference voltages for the CSB2 data because the LSB and CSB1 read voltages R11, R13, R15, R17, R19, R21, R23 and R25 can distinguish the unreliable threshold voltage distributions VD12, VD13, VD16, VD17, VD20, VD21, VD24 and VD25 for the CSB2 data from the remaining threshold voltage distributions VD11, VD14, VD15, VD18, VD19, VD22, VD23, and VD26. The LSB and CSB1 read voltages R11, R13, R15, R17, R19, R21, R23 and R25 may be read voltages that are positioned at the boundaries between the unreliable threshold voltage distributions VD12, VD13, VD16, VD17, VD20, VD21, VD24 and VD25 for the CSB2 data and the remaining threshold voltage distributions VD11, VD14, VD15, VD18, VD19, VD22, VD23, and VD26.

Because the reference voltages R11, R13, R15, R17, R19, R21, R23 and R25 are LSB and CSB1 read voltages, LSB and CSB1 pages may be defined as reference pages, and LSB and CSB1 data may be used as the reference data REFDT. Because the reference data REFDT (i.e., the LSB and CSB1 data) are respectively outputted as first values of "0" and "1" or "1" and "0," from the unreliable memory cells and are collectively outputted as a second value of "0" or "1" from the remaining memory cells, the unreliable memory cells and the remaining memory cells may be clearly distinguished from each other by the reference voltages R11, R13, R15, R17, R19, R21, R23 and R25. As a result, memory cells which respectively output the LSB and CSB1 data of the first value "0" and "1" or "1" and "0" according to the LSB and CSB1 read voltages R11, R13, R15, R17, R19, R21, R23 and R25 may be determined as the unreliable memory cells for the CSB2 data.

FIG. 6B exemplarily shows the LSB and CBS1 data as the reference data REFDT, and the CSB2 data as the target data TGDT, which are read from memory cells C11 to C17. In FIG. 6B, the memory cells C11, C13 and C14 which output "0" and "1" or "1" and "0" respectively as LSBs and CSB1s may be determined as the unreliable memory cells, and CSB2s read from the unreliable memory cells C11, C13 and C14 may be estimated as error bits.

According to an embodiment, even when the respective LSB, CSB1, and MSB page is selected as the target page, error bits may be estimated substantially similarly to the above-described method of FIGS. 6A and 6B. For example, when the LSB page or the CSB1 page is the target page and the LSB data or the CSB1 data is the target data TGDT, the CSB2 and MSB read voltages R12, R14, R16, R18, R20, R22 and R24 may be the reference voltages for the LSB data, the CSB2 and MSB pages may be the reference pages and the CSB2 and MSB data may be the reference data REFDT. When the MSB page is the target page and the MSB data is the target data TGDT, the LSB and CSB1 read voltages R13, R15, R17, R19, R21 and R23 may be the reference voltages for the MSB data, the LSB and CSB1 pages may be the reference pages and the LSB and CSB1 data may be the reference data REFDT.

Figure 7:
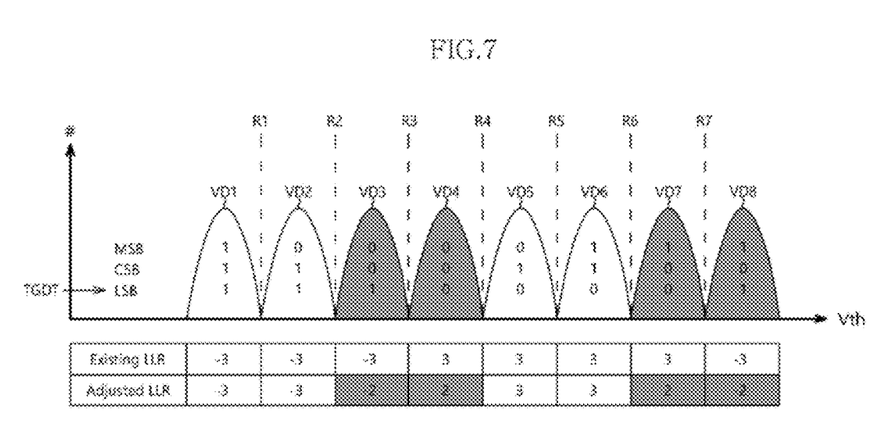
FIG. 7 is an exemplary LLR table illustrating an error correction operation, according to an embodiment of the present invention.

FIG. 7 is an exemplary LLR table illustrating an error correction operation, according to an embodiment of the present invention.

FIG. 7 exemplarily shows the error correction operation to the LSB data of TLCs by adjusting LLR values afforded to respective bits of the LSB data based on the above-described error bit estimation result. It is assumed that the LSBs are estimated as the error bits.

An LLR value represents the reliability of data read from a corresponding bit. The greater an absolute LLR value becomes, the more reliable the data read from the corresponding bit is regarded. The LLR value is used for the error correction operation to the corresponding data. According to an embodiment of the present invention, the absolute LLR value of the LSB estimated as an error bit may be adjusted as less than a current value. In an embodiment, the absolute LLR value of the LSB estimated as an error bit may be adjusted as less than that of another LSB other than the error-estimated LSB. For example, the absolute LLR value of the LSBs read from the unreliable memory cells which are positioned in the unreliable threshold voltage distributions VD3, VD4, VD7 and VD8 for the LSB data may be adjusted to 2, which is less than the current value of "3".

According to an embodiment, the current LLR value may be one that is used in the pre-error correction operation before the error bit estimation operation.

The error-estimation result of the target data TGDT is reflected in the adjusted LLR value and the error correction operation may be performed with the adjusted LLR value. Since the error correction operation is performed to the target data TGDT with the more reliable LLR value, the success rate of error correction may be increased.

Figure 8:
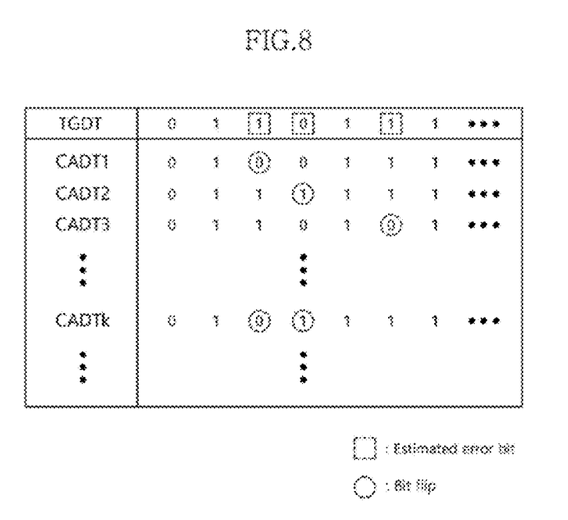
FIG. 8 is an exemplary list of bit-flipped target data illustrating an error correction operation, according to an embodiment of the present invention.

FIG. 8 is an exemplary list of bit-flipped target data illustrating an error correction operation, according to an embodiment of the present invention.

FIG. 8 exemplarily shows the target data TGDT in which error bits (represented by dotted box in FIG. 8) are estimated and a set of candidate data CADT1, CADT2, CADT3 and CADTk generated as a result of the bit flip operation to the target data TGDT.

The set of candidate data CADT1, CADT2, CADT3 and CADTk may be generated sequentially by bit-flipping each one of the estimated error bits of the target data TGDT one at a time. Since error bits may be corrected through the bit flip operation, the candidate data CADT1, CADT2, CADT3 and CADTk may include less error bits than the target data TGDT. Therefore, as the candidate data CADT1, CADT2, CADT3 and CADTk are sequentially generated and the error correction operation is performed to the candidate data CADT1, CADT2, CADT3 and CADTk until the error correction operation succeeds, the success rate of error correction may be increased.

Various error correction techniques known in the art may be applied to the error correction operation, hence, detailed description thereof will be omitted herein.

Figure 9:
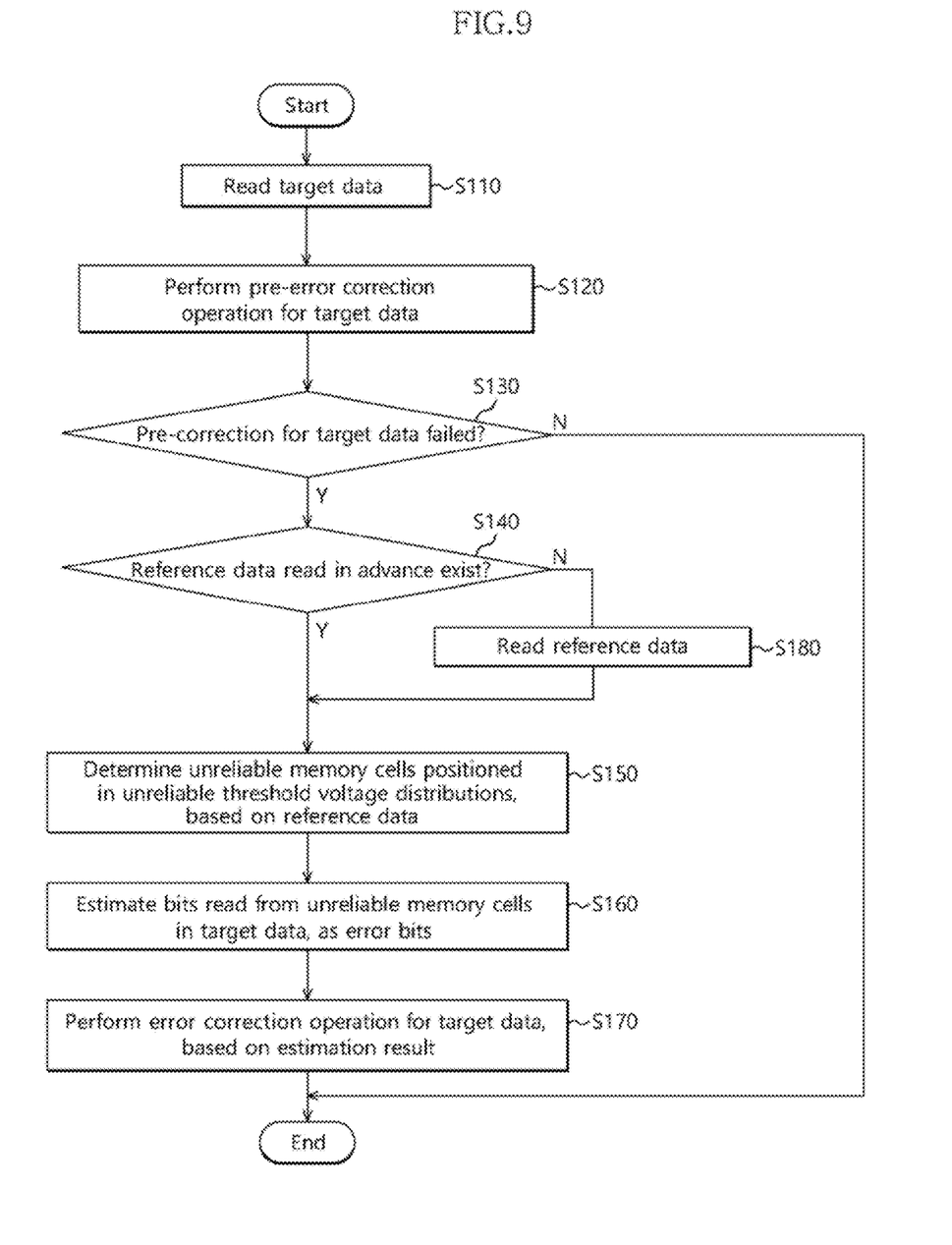
FIG. 9 is a flow chart illustrating a method for operating the data storage device of FIG. 1, according to an embodiment of the present invention.

FIG. 9 is a flow chart illustrating a method for operating the data storage device 10 of FIG. 1, according to an embodiment of the present invention.

Referring to FIG. 9, at step S110, the controller 100 may read the target data TGDT (e.g., a CSB2 data of FIG. 6A) from the target page (e.g., a CSB2 page of FIG. 6A) corresponding to a plurality of memory cells.

At step S120, the controller 100 may perform a pre-error correction operation to the target data TGDT.

At step S130, the controller 100 may determine whether a pre-correction failure has occurred for the target data TGDT. When a pre-correction failure has occurred, the process may proceed to step S140. When a pre-correction failure has not occurred, that is, in the case of a correction success, the process may be ended.

At the step S140, the controller 100 may determine whether reference data REFDT (e.g., the CSB1 and LSB data of FIG. 6A) read in advance exists. At least one reference page (e.g., the CSB1 and LSB pages of FIG. 6A) from which the reference data REFDT is read may depend upon the target page (e.g., the CSB2 page of FIG. 6A) from which the target data TGDT is read. The reference page may be a page for which a read operation is to be performed based on read voltages (e.g., the LSB and CSB1 read voltages R11, R13, R15, R17, R19, R21, R23 and R25 of FIG. 6A) positioned at the boundaries between unreliable threshold voltage distributions for the target data TGDT (e.g., the unreliable threshold voltage distributions VD12, VD13, VD16, VD17, VD20, VD21, VD24 and VD25 for the CSB2 data of FIG. 6A) and the remaining threshold voltage distributions. When reference data REFDT exists, the process may proceed to step S150. When reference data REFDT does not exist, the process may proceed to step S180.

At the step S180, the controller 100 may read reference data REFDT from a reference page.

At the step S150, the controller 100 may determine the unreliable memory cells which are positioned in the unreliable threshold voltage distributions for the target data TGDT based on the reference data REFDT. The controller 100 may determine the memory cells which output a predetermined value (e.g., the first value of FIG. 6A) in the reference data REFDT, as unreliable memory cells.

At step S160, the controller 100 may estimate bits read from the unreliable memory cells in the target data TGDT as error bits.

At step S170, the controller 100 may perform the error correction operation to the target data TGDT based on an estimation result. For example, the controller 100 may perform the error correction operation by adjusting the absolute LLR value of the corresponding one among the error-estimated bits of step S160 as described with reference to FIG. 7 or by bit-flipping the respective error-estimated bits of S160 as described with reference to FIG. 8.

Figure 10:
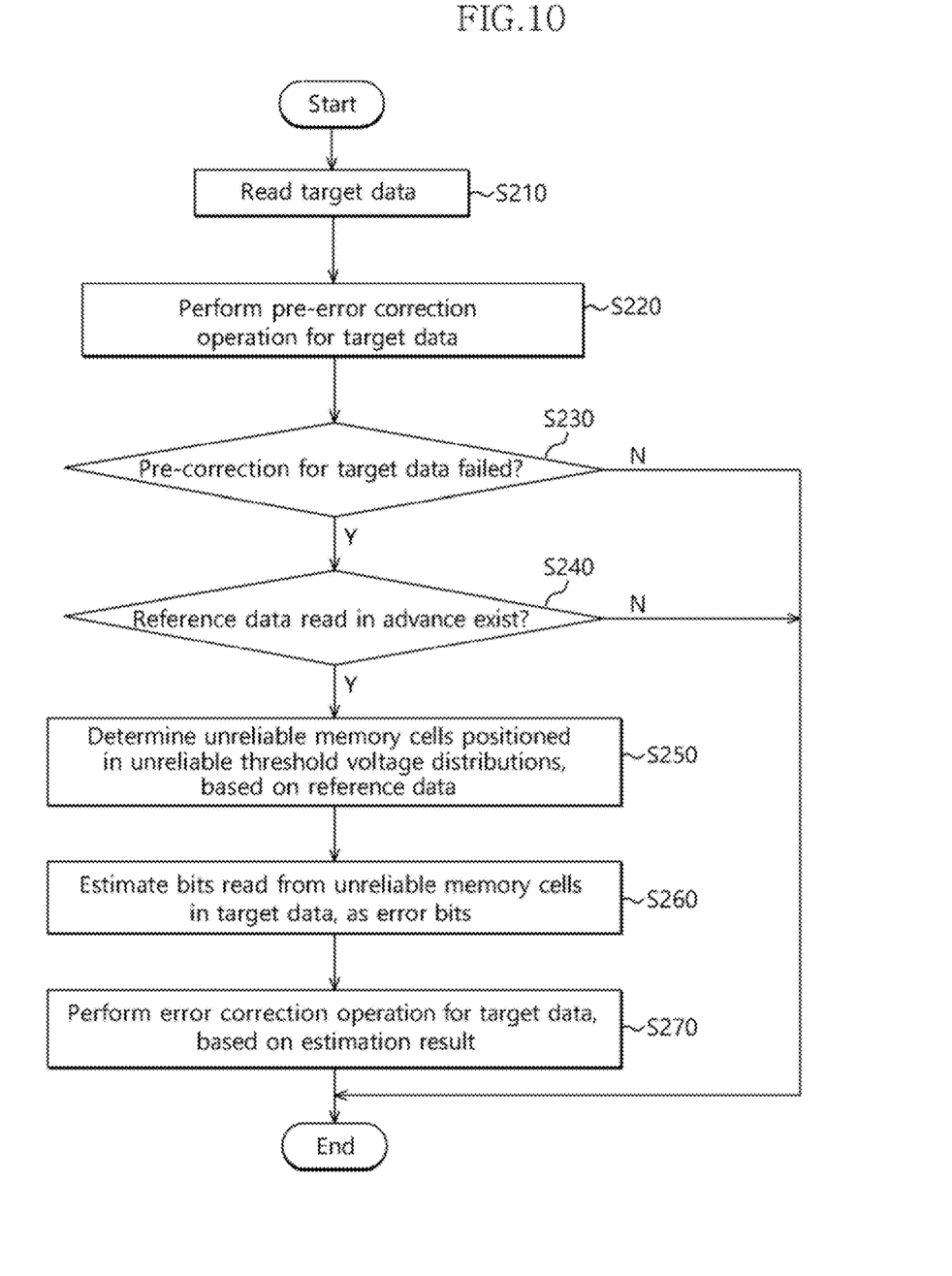
FIG. 10 is a flow chart illustrating a method for operating the data storage device of FIG. 1, according to another embodiment of the present invention.

FIG. 10 is a flow chart illustrating a method for operating the data storage device of FIG. 1, according to another embodiment of the present invention.

Referring to FIG. 10, steps S210 to S230 and S250 to S270 may be substantially the same as the steps S110 to S130 and S150 to S170 of FIG. 9, and thus, detailed descriptions thereof will be omitted herein.

At step S240, the controller 100 may determine whether reference data REFDT (e.g., the CSB1 and LSB data of FIG. 6A) read in advance exists. When reference data REFDT exists, the process may proceed to the step S250. When reference data REFDT does not exist, the process may be ended.

Figure 11:
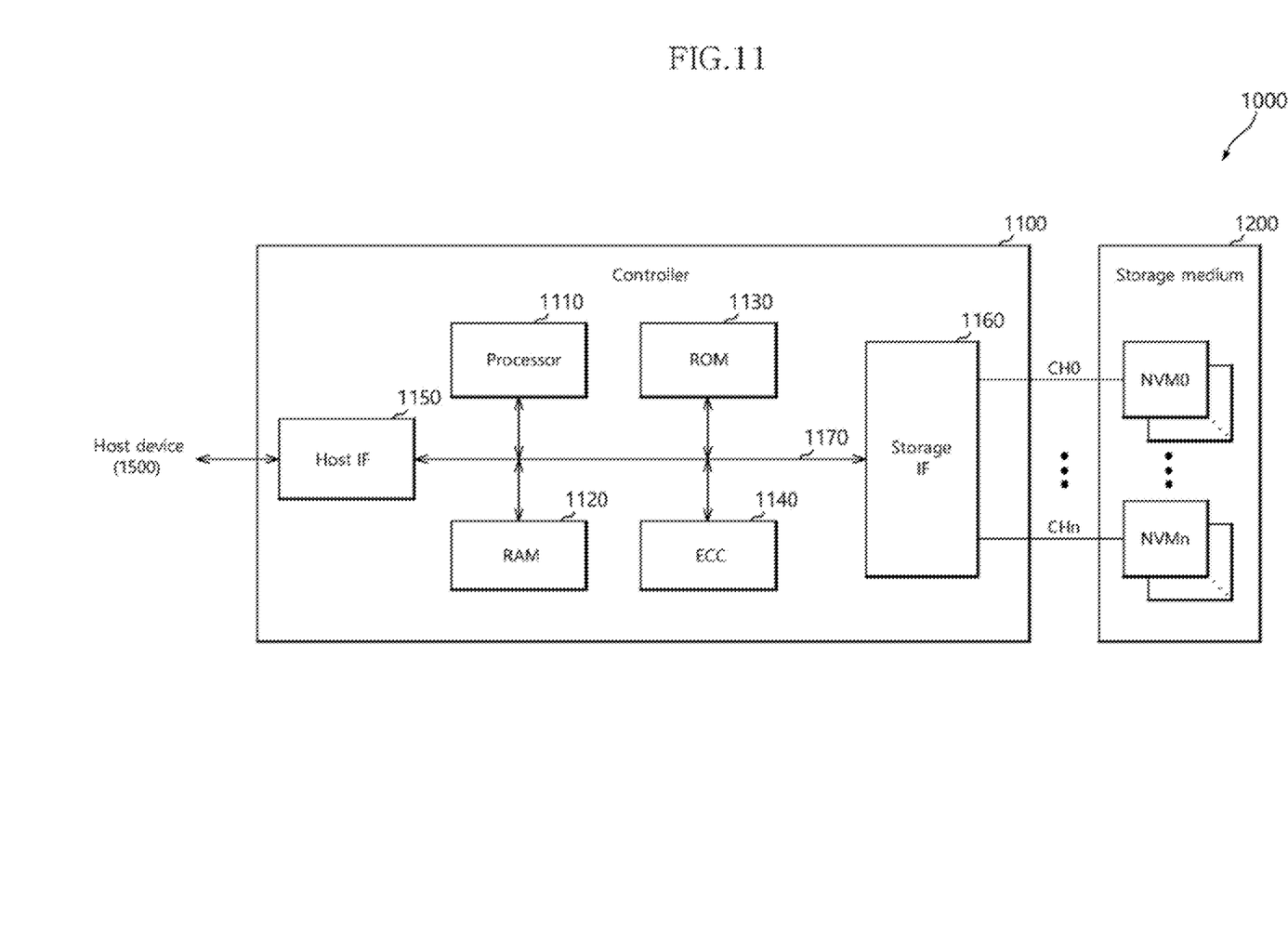
FIG. 11 is a block diagram illustrating a solid state drive (SSD), according to an embodiment of the present invention.

FIG. 11 is a block diagram illustrating a representation of an example of a solid state drive (SSD) 1000 according to an embodiment of the present invention.

The SSD 1000 may include a controller 1100 and a storage medium 1200.

The controller 1100 may control data exchange between a host device 1500 and the storage medium 1200. The controller 1100 may include a processor 1110, a RAM 1120, a ROM 1130, an ECC unit 1140, a host interface 1150, and a storage medium interface 1160.

The controller 1100 may operate in substantially the same manner as the controller 100 of FIG. 1. The controller 1100 may read target data from a target page corresponding to a plurality of memory cells of a nonvolatile memory device, estimate error bits of the target data based on reference data read from one or more reference pages corresponding to the plurality of memory cells, and perform an error correction operation to the target data, based on the estimation result.

The processor 1110 may control the operations of the controller 1100. The processor 1110 may store data in the storage medium 1200 and read stored data from the storage medium 1200, according to data processing requests from the host device 1500. In order to efficiently manage the storage medium 1200, the processor 1110 may control internal operations of the SSD 1000 such as a merge operation, a wear leveling operation, and so forth.

The RAM 1120 may store programs and program data to be used by the processor 1110. The RAM 1120 may temporarily store data transmitted from the host interface 1150 before transferring them to the storage medium 1200, and may temporarily store data transmitted from the storage medium 1200 before transferring them to the host device 1500.

The ROM 1130 may store program codes to be read by the processor 1110. The program codes may include commands to be processed by the processor 1110 for the processor 1110 to control the internal units of the controller 1100.

The ECC unit 1140 may encode data to be stored in the storage medium 1200, and may decode data read from the storage medium 1200. The ECC unit 1140 may detect and correct an error occurred in data, according to an ECC algorithm.

The host interface 1150 may exchange data processing requests, data, etc. with the host device 1500.

The storage medium interface 1160 may transmit control signals and data to the storage medium 1200. The storage medium interface 1160 may be transmitted with data from the storage medium 1200. The storage medium interface 1160 may be coupled with the storage medium 1200 through a plurality of channels CH0 to CHn.

The storage medium 1200 may include a plurality of nonvolatile memory devices NVM0 to NVMn. Each of the plurality of nonvolatile memory devices NVM0 to NVMn may perform a write operation and a read operation according to the control of the controller 1100.

Figure 12:
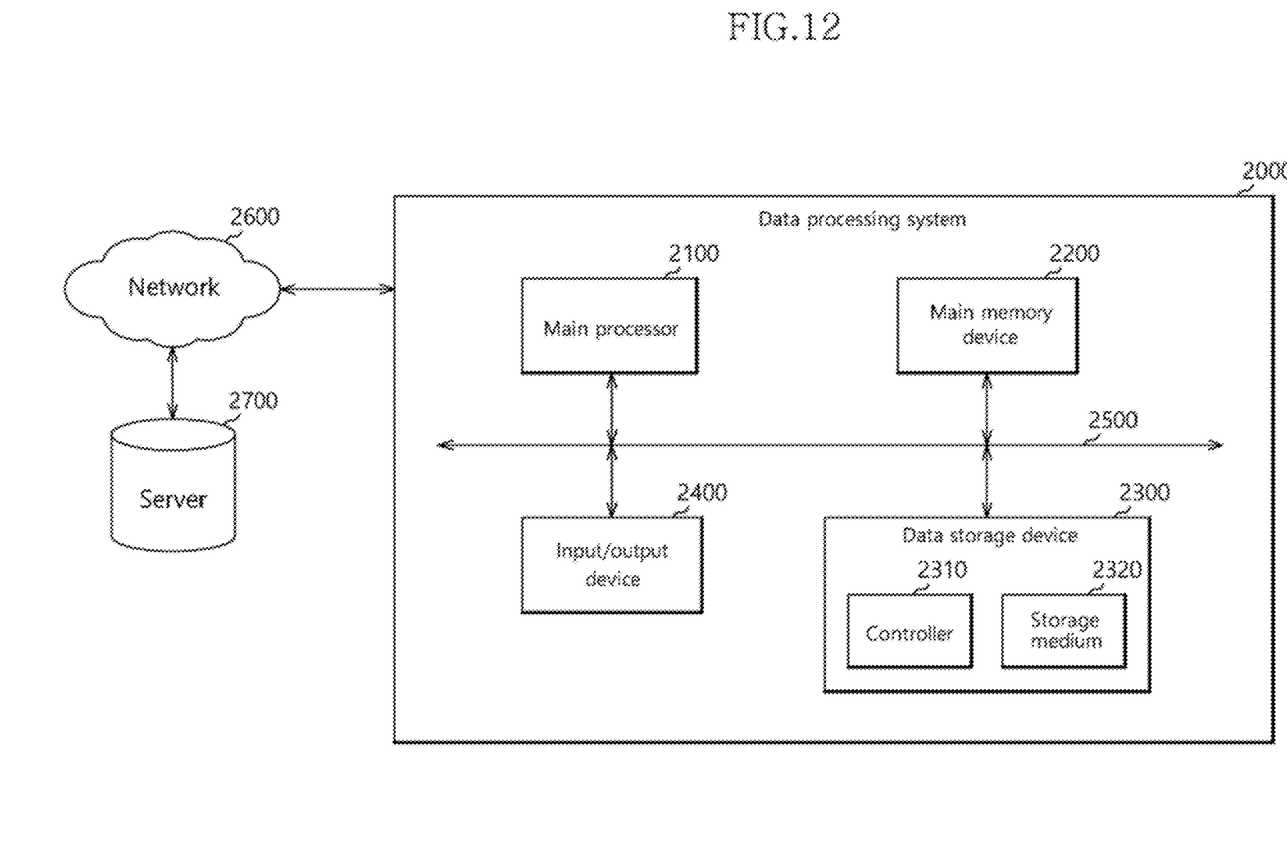
FIG. 12 is a block diagram illustrating a data processing system including a data storage device, according to an embodiment of the present invention.

FIG. 12 is a block diagram illustrating a representation of an example of a data processing system 2000 to which the data storage device 10 according to an embodiment is applied as a data storage device 2300.

The data processing system 2000 may include a computer, a laptop, a netbook, a smart phone, a digital TV, a digital camera, a navigator, etc. The data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control general operations of the data processing system 2000. The main processor 2100 may be, for example, a central processing unit such as a microprocessor. The main processor 2100 may execute the software of an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate in a manner substantially similar to the data storage device 10 of FIG. 1.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a local area network (LAN), a wide area network (WAN), a wireless network, and so on. The data processing system 2000 may include a network interface (not shown) to access the network 2600.

While various embodiments have been described above, it will be understood to those skilled in the art that the embodiments described are examples only. Accordingly, the data storage device and the operating method thereof described herein should not be limited based on the described embodiments. Many other embodiments and or variations thereof may be envisaged by those skilled in the relevant art without departing from the spirit and or scope of the present invention as defined in the following claims.

What is claimed is:
1. A data storage device comprising:
a nonvolatile memory device including a plurality of memory cells corresponding to a plurality of pages, the nonvolatile memory device suitable for read-accessing each page based on a corresponding read voltage set among a plurality of read voltage sets; and
a controller suitable for reading target data from a target page among the pages, reading reference data from at least one reference page among the pages except the target page, determining unreliable memory cells for the target data based on the reference data, estimating bits read from the unreliable memory cells in the target data as error bits of the target data, and performing an error correction operation to the target data based on a result of the estimation,
wherein the target page corresponds to a first read voltage set including first read voltages among a plurality of read voltages,
wherein the pages include another page corresponding to a second read voltage set, the second read voltage set including second read voltages which are not adjacent to the first read voltages among the plurality of read voltages, and wherein the controller does not select the another page as the at least one reference page.

2. The data storage device according to claim 1, wherein the controller determines memory cells having threshold voltages positioned in unreliable threshold voltage distributions as the unreliable memory cells.

3. The data storage device according to claim 2, wherein the controller determines memory cells, from which the reference data of a predetermined value is read, as the unreliable memory cells.

4. The data storage device according to claim 2, wherein the unreliable threshold voltage distributions are adjacent to respective the first read voltages used to read the target page.

5. The data storage device according to claim 2, wherein the reference data is read according to reference voltages positioned at boundaries between the unreliable threshold voltage distributions and remaining threshold voltage distributions.

6. The data storage device according to claim 1, wherein the controller estimates the error bits when the reference data has been read in advance when a pre-correction failure occurs for the target data.

7. The data storage device according to claim 1, wherein the controller performs the error correction operation to the target data by decreasing magnitudes of LLR values corresponding to the estimated error bits.

8. The data storage device according to claim 1, wherein the controller performs the error correction operation to the target data by bit-flipping each one of the estimated error bits.

9. A method for operating a data storage device including a nonvolatile memory device, the nonvolatile memory device including a plurality of memory cells corresponding to a plurality of pages, the nonvolatile memory device suitable for read-accessing each page based on a corresponding read voltage set among a plurality of read voltage sets, comprising:
reading target data from a target page among the pages;
reading reference data from at least one reference page among the pages except the target page;
determining unreliable memory cells for the target data based on the reference data;
estimating bits read from the unreliable memory cells in the target data as error bits of the target data; and
performing an error correction operation to the target data based on a result of the estimation,
wherein the target page corresponds to a first read voltage set including first read voltages among a plurality of read voltages,
wherein the pages include another page which is not selected as the at least one reference page, the another page corresponding to a second read voltage set including second read voltages which are not adjacent to the first read voltages among the plurality of read voltages.

10. The method according to claim 9, wherein the estimating of the error bits comprises:
determining memory cells positioned in unreliable threshold voltage distributions as the unreliable memory cells.

11. The method according to claim 10, wherein the determining of the unreliable memory cells comprises determining memory cells, from which output the reference data of a predetermined value is read, as the unreliable memory cells.

12. The method according to claim 10, wherein the unreliable threshold voltage distributions are adjacent to respective the first read voltages used to read the target page.

13. The method according to claim 10, wherein the estimating the error bits includes reading the reference data according to reference voltages positioned at boundaries between the unreliable threshold voltage distributions and remaining threshold voltage distributions.

14. The method according to claim 9, wherein the estimating of the error bits is performed when the reference data has been read in advance when a pre-correction failure occurs for the target data.

15. The method according to claim 9, wherein the performing of the error correction operation comprises decreasing magnitudes of LLR values corresponding to the estimated error bits.

16. The method according to claim 9, wherein the performing of the error correction operation comprises:
bit-flipping each one of the estimated error bits.

17. A data storage device comprising:
a nonvolatile memory device including a plurality of memory cells corresponding to a plurality of pages, the nonvolatile memory device suitable for read-accessing each page based on a corresponding read voltage set among a plurality of read voltage sets; and
a controller suitable for estimating, based on at least one reference bit read from a target memory cell, whether a target bit read from the target memory cell is an error bit,
wherein, when the controller determines based on the reference bit that the target memory cell is positioned in an unreliable threshold voltage distribution among a plurality of threshold voltage distributions, the controller determines the target bit as the error bit,
wherein the controller reads the target bit from the target memory cell based on a first read voltage set including first read voltages among a plurality of read voltages,
wherein the controller reads the reference bit from the target memory cell based on a second read voltage set including second read voltages which are adjacent to the first read voltages among the plurality of read voltages,
wherein the target memory cell stores a further bit being read based on a third read voltage set including third read voltages which are not adjacent to the first read voltages among the plurality of read voltages, and
wherein the controller does not select the further bit as the reference bit.

18. The data storage device according to claim 17, wherein the controller determines the target bit is the error bit, when the reference bit has a predetermined value.

19. The data storage device according to claim 18, wherein the predetermined value depends on a page from which the target bit is read.

* * * * *